(12) United States Patent
Shroff et al.

(10) Patent No.: US 6,500,750 B1
(45) Date of Patent: Dec. 31, 2002

(54) SEMICONDUCTOR DEVICE AND METHOD OF FORMATION

(75) Inventors: Mehul D. Shroff, Austin; Philip G. Grigg, Cedar Park, both of TX (US)

(73) Assignee: Motorola, Inc., Schaumburg, IL (US)

( * ) Notice: Subject to any disclaimer, the term of this patent is extended or adjusted under 35 U.S.C. 154(b) by 9 days.

(21) Appl. No.: 09/609,523

(22) Filed: Jul. 3, 2000

Related U.S. Application Data

(63) Continuation of application No. 09/285,666, filed on Apr. 5, 1999.

(51) Int. Cl.[7] .......................................... H01L 21/4763
(52) U.S. Cl. ...................................... 438/622; 438/724
(58) Field of Search .............................. 438/10, 12, 17, 438/18, 622, 624, 724, 738, 740, 741, 744, 633, 671, 945, 975

(56) References Cited

U.S. PATENT DOCUMENTS

| | | | | |
|---|---|---|---|---|
| 5,434,751 A | * | 7/1995 | Cole, Jr. et al. | 361/792 |
| 5,554,940 A | * | 9/1996 | Hubacher | 324/765 |
| 5,817,572 A | * | 10/1998 | Chiang et al. | 438/624 |
| 5,863,825 A | | 1/1999 | Pasch et al. | |
| 5,976,898 A | * | 11/1999 | Marty et al. | 438/12 |
| 6,020,263 A | | 2/2000 | Shih et al. | |
| 6,017,208 A | * | 8/2000 | Cheng et al. | |
| 6,110,648 A | * | 8/2000 | Jang | 430/312 |
| 6,157,081 A | * | 12/2000 | Nariman et al. | 257/752 |
| 6,157,087 A | | 12/2000 | Zhao et al. | |

FOREIGN PATENT DOCUMENTS

WO  WO99/08314  2/1999

* cited by examiner

Primary Examiner—Hoai V. Ho
Assistant Examiner—Phuc T. Dang
(74) Attorney, Agent, or Firm—Robert A. Rodriguez

(57) ABSTRACT

A semiconductor device and its method of formation are disclosed wherein a surface of a semiconductor substrate is planarized to form an interconnect (1244) within a dielectric layer (1243). The top surface of the dielectric layer is then recessed with respect to a top surface of the interconnect to form a step (201). An opaque film (301) is then deposited over the surface of the semiconductor substrate. The opaque film (301) is lithographically patterned and etched, wherein an alignment of the patterning layer (401) is accomplished using topographically discernable features (303) that are formed in the opaque film (301) in regions where the step (201) between the interconnect (1244) and dielectric layer (1243) is produced.

19 Claims, 4 Drawing Sheets

SEMICONDUCTOR DEVICE AND METHOD OF FORMATION

RELATED APPLICATION

The application is related to U.S. patent application Ser. No. 09,285,666 entitled "Semiconductor Device and Method of Formation," filed on Apr. 5, 1999, assigned to the Assignee hereof, and is hereby incorporated by reference.

FIELD OF THE INVENTION

The invention relates generally to semiconductor devices and more particularly to the alignment of features on a semiconductor device substrate.

RELATED ART

Manufacturing semiconductor devices requires depositing various layers of materials over semiconductor device substrates and then patterning and etching the layers to form semiconductor device features. The successive steps of depositing, patterning, and etching eventually form is more complicated semiconductor device structures, such as transistors, capacitors, interconnects, and the like. Aligning the features formed at one level to a previous level requires using advanced photolithography equipment. Typically, the alignment requires an ability to detect optical contrasts from alignment marks formed in underlying layers. This can usually be accomplished by aligning the patterning layer to alignment marks through transparent films, such as silicon dioxide, or by using the surface topography created by underlying alignment marks.

However, semiconductor manufacturing is increasingly using chemical mechanical polishing (CMP) processes to planarize the substrate surface before depositing subsequent films. Planarizing the surface reduces the amount of topography that can be used for alignment purposes. Therefore, when non-transparent films are deposited over the surface of a planarized substrate, no means exist to adequately align either through the film to an underlying feature or using surface topography. Consequently, patterning process at these levels can be highly inaccurate and the resulting increase in the level of lithographic reworks (i.e. removing and re-patterning the resist) due to poor alignment can be costly and time-consuming.

Prior art methods that attempt to overcome this problem include over-polishing and upsizing alignment mark dimensions to create topography in the substrate surface. Unfortunately, the topography resulting from the over-polishing only produces smooth changes in the surface of the substrate, which provides poor contrast. Upsizing alignment mark dimension provides topography by preventing the alignment marks from completely filling with deposited material. However, this topography similarly has smooth surfaces that are difficult to use for alignment purposes.

BRIEF DESCRIPTION OF THE FIGURES

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In accordance with an embodiment of the present invention, a semiconductor device and its method of formation are disclosed. In one embodiment an interconnect is formed within a dielectric layer, the dielectric layer is recessed with respect to the interconnect surface, and a barrier layer is formed over the interconnect. Substrate surface topography resulting from the recess is then used to align a resist pattern over the surface of the barrier layer. The barrier layer is then etched, wherein remaining barrier layer portions are aligned to the interconnect. An embodiment of the present invention will now be discussed in further detail with respect to the accompanying figures.

Figure 1:
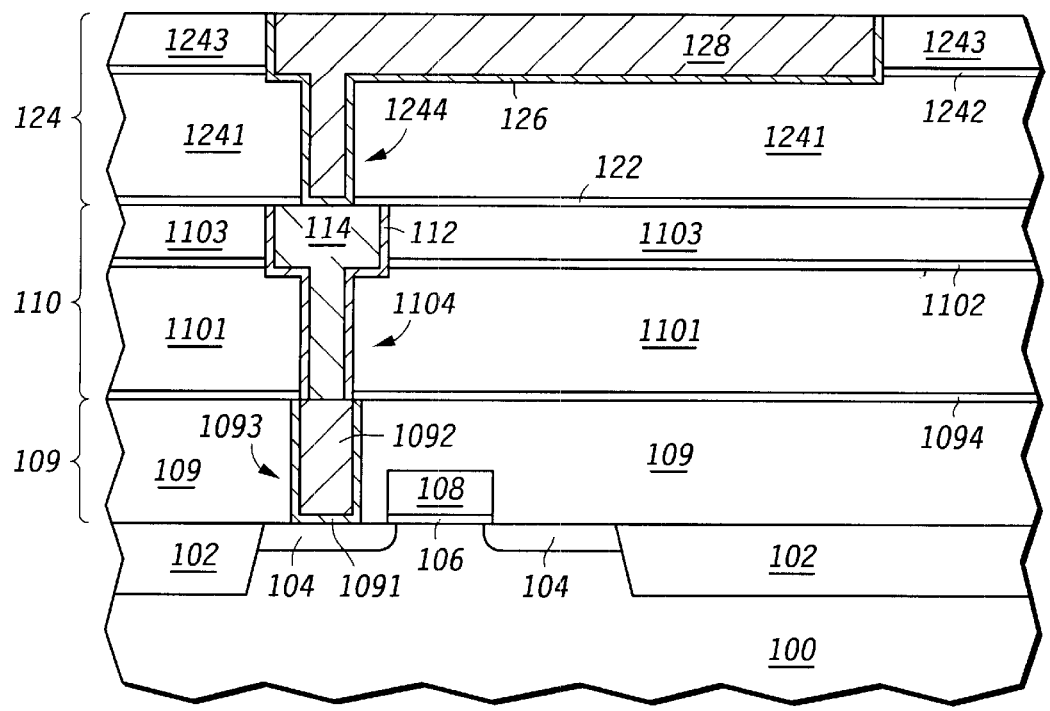
FIG. 1 includes an illustration of a cross-sectional view of a partially processed semiconductor device including an interconnect level with an exposed upper surface.

FIG. 1 includes an illustration of a cross-sectional view of a portion of a semiconductor device. The semiconductor device includes a monocrystalline semiconductor substrate 100, isolation regions 102, and doped regions 104. A gate dielectric 106 overlies portions of the semiconductor device substrate 100 and a gate electrode 108 overlies the gate dielectric 106.

A first interlevel dielectric layer (ILD) 109 is formed over the gate electrode 108 and the semiconductor device substrate 100. In one embodiment the ILD layer 109 is a layer of a silicon dioxide based material, deposited by chemical vapor deposition (CVD), which is formed using tetraethoxysilane (TEOS) as a source gas. Alternatively, ILD layer 109 may be a layer of silicon nitride, a layer of phosphosilicate glass (PSG), a layer of borophosphosilicate glass (BPSG), a spin on glass (SOG) layer, a layer of silicon oxynitride (SiON), a polyimide layer, a layer of a low-k dielectric material (for the purposes of this specification a low-k dielectric material is any material having a dielectric constant less than approximately 3.6), or the like.

The first ILD layer 109 is then patterned to form an opening that is filled with an adhesion/barrier layer 1091 and a plug fill material 1092. The adhesion/barrier layer 1091 is typically a refractory metal, such as tungsten (W) titanium (Ti), tantalum (Ta), and the like, a refractory metal nitride, or a combination of refractory metals or their nitrides. The plug fill material 1092 is typically tungsten, aluminum, copper, or a like conductive material. The adhesion/barrier layer 1091 and plug fill material can be deposited using physical vapor deposition (PVD), CVD or a combination of PVD and CVD processes. After depositing the adhesion/barrier layer 1091 and the plug fill material 1092, the substrate is polished to remove portions of the adhesion/barrier layer 1091 and plug fill material 1092 not contained within the opening to form the conductive plug 1093 shown in FIG. 1.

After forming the first ILD layer 109 and the conductive plug 1093, a second ILD layer 110 is formed over the substrate surface (Note, when used in this context "substrate surface" includes the semiconductor device substrate as well as all layers fabricated on the semiconductor/device substrate up to the point of processing under discussion. Therefore, substrate surface refers to the present uppermost surface of the substrate, including all structures formed thereon). In accordance with one embodiment of the present invention, the second ILD layer 110 is formed as a combination of layers and includes etch stop layer (ESL) 1094, a lower dielectric film 1101 an etch stop layer 1102, and an upper dielectric film 1103. In accordance with one embodiment, the ESL layer 1094 is a layer of silicon nitride ($Si_3N_4$) formed using conventional CVD techniques. Alternatively, ESL 1094 may be a layer of CVD silicon oxynitride (SiON), boron nitride (BN), or the like. The lower and upper dielectric films 1101 and 1103 can be formed using materials and processes similar to those used to form the ILD layer 109. The ESL 1102 can be formed using materials and processes similar to those used to form the ESL 1094. Typically the etch stop layers 1102 and 1094 are formed using materials having substantially different etch characteristics with respect to the upper and lower dielectric films 1101 and 1103. Typically, the etch selectivity between the etch stop layers 1102 and 1094 and the upper and lower dielectric films 1101 and 1103 is greater than approximately 10:1.

After forming the second ILD layer 110, it is patterned and etched to form a dual inlaid opening. The dual inlaid opening can be formed using a variety of conventional methods that can include trench-first via-last, via-first trench-last, buried via, and the like. The dual inlaid opening is filled with an adhesion/barrier layer 112 and a copper fill material 114. In one embodiment, the adhesion/barrier layer 112 is a layer of tantalum nitride. Alternatively adhesion barrier layer 112 can be a layer of titanium nitride, a layer of tungsten nitride, a layer of tantalum silicon nitride, a layer of tantalum, a titanium-tungsten layer, or the like. The adhesion barrier layer 112 can be deposited using conventional PVD or CVD techniques. In one embodiment, a seed layer (not shown) is then formed overlying the adhesion barrier layer 112. The seed layer is a layer of PVD copper, typically having a thickness which is insufficient to fill the dual inlaid opening but thick enough to conduct and carry the current densities required for electroplating a subsequently electroplated conductive metal layer. In one embodiment, the seed layer has a thickness in a range of 50–200 nanometers. Alternatively the seed layer may be formed using other conductive materials, such as nickel and deposited using other processes, such as electroless plating or CVD.

In accordance with one embodiment, an electroplating process is then used to deposit a conductive metal layer 114 within the dual inlaid opening. The conductive metal layer 114 has a thickness that is sufficient to fill the dual inlaid opening. In one embodiment the conductive metal layer 114 is a layer of copper or a copper alloy, wherein the copper content is at least 90 atomic percent. The copper can be alloyed with elements such as magnesium, sulfur, carbon, boron, or the like to improve adhesion, stress, electromigration resistance, or other properties of the interconnect. After depositing the adhesion/barrier layer 112 and the cooper filled material 114, the substrate surface is polished to remove portions of the adhesion/barrier layer 112 and copper filled material 114 not contained within the dual inlaid opening to form a dual inlaid interconnect 1104 as shown in FIG. 1.

After forming the dual inlaid interconnect 1104, a third ILD layer 124 is formed over the substrate surface. In accordance with one embodiment, the third ILD layer 124 is a combination of films that include barrier layer 122, lower dielectric film 1241, ESL 1242, and upper dielectric layer 1243. In one embodiment, the barrier layer 122 is a layer of silicon nitride formed using conventional CVD techniques. Alternatively, barrier layer 122 may be a layer of CVD silicon oxynitride, boron nitride, or the like. In one embodiment, the lower dielectric film 1241 and the upper dielectric film 1243 are formed using materials and processes similar to those used to form the ILD layer 109 and the ESL 1242 is formed using materials and processes similar to those used to form ESL 1102, described previously. A dual inlaid interconnect 1244 comprising an adhesion/barrier layer 126 and a copper fill material 128 are formed within the third ILD layer 124. In one embodiment, the dual inlaid interconnect 1244 is formed using materials and processes similar to those used to form the dual inlaid interconnect 1104 described previously. In accordance with one embodiment of the present invention, the substrate surface is substantially planarized as a result of the CMP process used to remove portions of the adhesion/barrier layer 126 and a copper fill material 128 not contained within the dual inlaid interconnect opening. Up to this point, one of ordinary skill in the art recognizes that conventional processing has been used to form the semiconductor device shown in FIG. 1.

Figure 2:
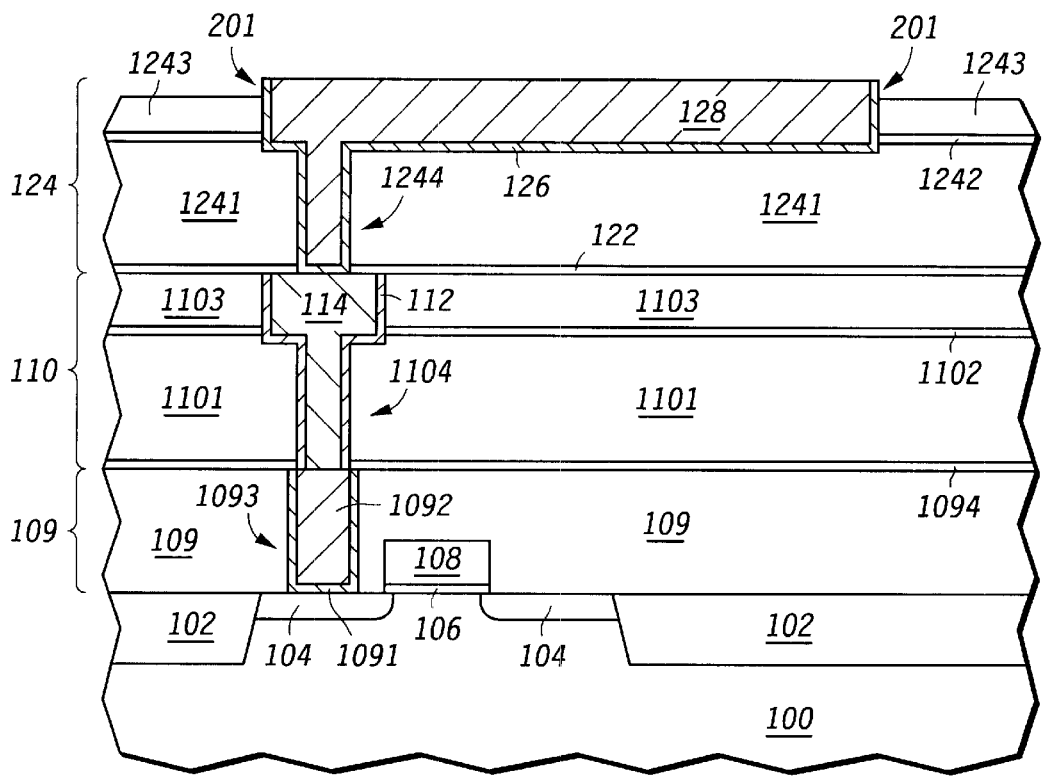
FIG. 2 includes an illustration of a cross-sectional view of the semiconductor device of FIG. 1, wherein the top surface of the dielectric layer is recessed relative to the top surface of the interconnect.

Referring now to FIG. 2, in accordance with an embodiment of the present invention, the semiconductor device substrate shown in FIG. 1 has been processed to recess the top surface of upper dielectric film 1243 relative to the top surface of the interconnect 1244. In a preferred embodiment, the recessing of the dielectric film 1243 exposes edge regions of the of the interconnect 1244. The exposed edge regions define a step 201 between the interconnect 1244 and the surface of the dielectric layer 1243 as shown in FIG. 2. In accordance with one embodiment, the dielectric layer 1243 is recessed using a reactive ion etch (RIE) process that removes approximately 50 to 70 nanometers of dielectric layer 1243 from the substrate surface. Portions of the dielectric layer 1243 can be removed using conventional chlorofluorocarbon-based reactive ion etch (RIE) process chemistries. Alternatively, other RIE, plasma, or wet processing chemistries can be used to recess the surface of the dielectric layer relative to the interconnect. Preferably, to improve the topography contrast of a subsequently formed opaque film, the sidewall angle of the step 201 is greater than approximately 60 degrees. More preferably the sidewall angle is greater than approximately 80 degrees. Even more preferably, the sidewall angle will be determined by the exposed sidewall portions of the interconnect 1244. When forming the step 201 it may be advantageous to minimize the etch time to reduce pitting of the interconnect surface as well as minimize exposure of the RIE chamber environment to elemental copper which could potentially contaminate the etch chamber. The present inventors have discovered that the step 201 created by the RIE etch produces topography on the substrate surface that can advantageously be used to improve alignment capabilities and reduce overlay error at the subsequent patterning operation, as will be discussed.

Figure 3:
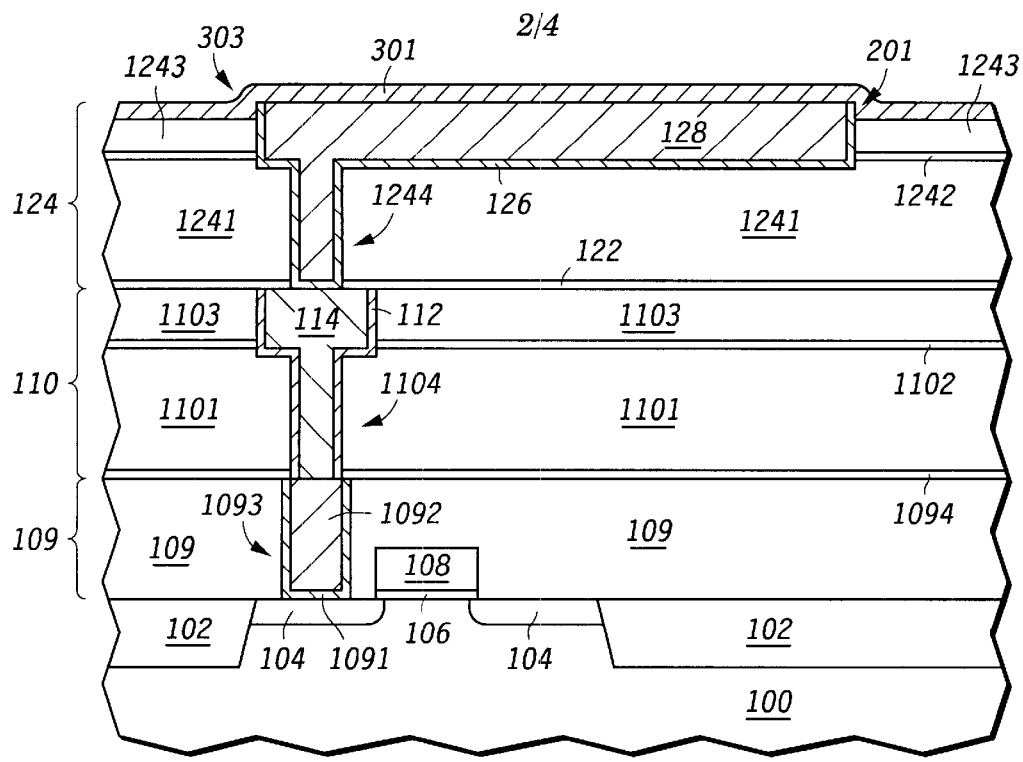
FIG. 3 includes an illustration of a cross-sectional view of the semiconductor device of FIG. 2 further showing an opaque film formed over the uppermost surface of the semiconductor device substrate.

Turning now to FIG. 3 an opaque layer 301 is formed over the substrate surface (For the purposes of this specification an opaque layer includes layers or films which are reflective or absorptive at all wavelengths of light between and including 400–700 nanometers or do not transmit electromagnetic radiation of a specified type used by photolithography equipment for alignment purposes). In accordance with one embodiment, the opaque layer is a conductive barrier layer 301, such as a tantalum nitride (TaN) layer deposited using physical vapor deposition (PVD). Alternatively the conductive barrier layer 301 can be deposited using a CVD process or formed using other materials including titanium nitride (TiN), tungsten nitride (WN), tantalum (Ta), tungsten (W), titanium tungsten nitride (TiWN), titanium tungsten (TiW), tungsten nitride (WN), molybdenum nitride (MoN), cobalt nitride (CoN), a combination of thereof, or the like. In accordance with embodiments of the present invention, topography 303 in the conductive barrier layer 301 is now discernible as a result of the topography formed by recessing the top portions of upper dielectric layer 1243 and forming the step 201. The topography formed using embodiments of the present invention is advantageous over the prior art methods of overpolishing and alignment mark upsizing because it can be modulated by varying the height of step 201 to provide varying degrees of contrast, which can be optimized for alignment and exposure purposes of subsequently formed resist layers.

Figure 4:
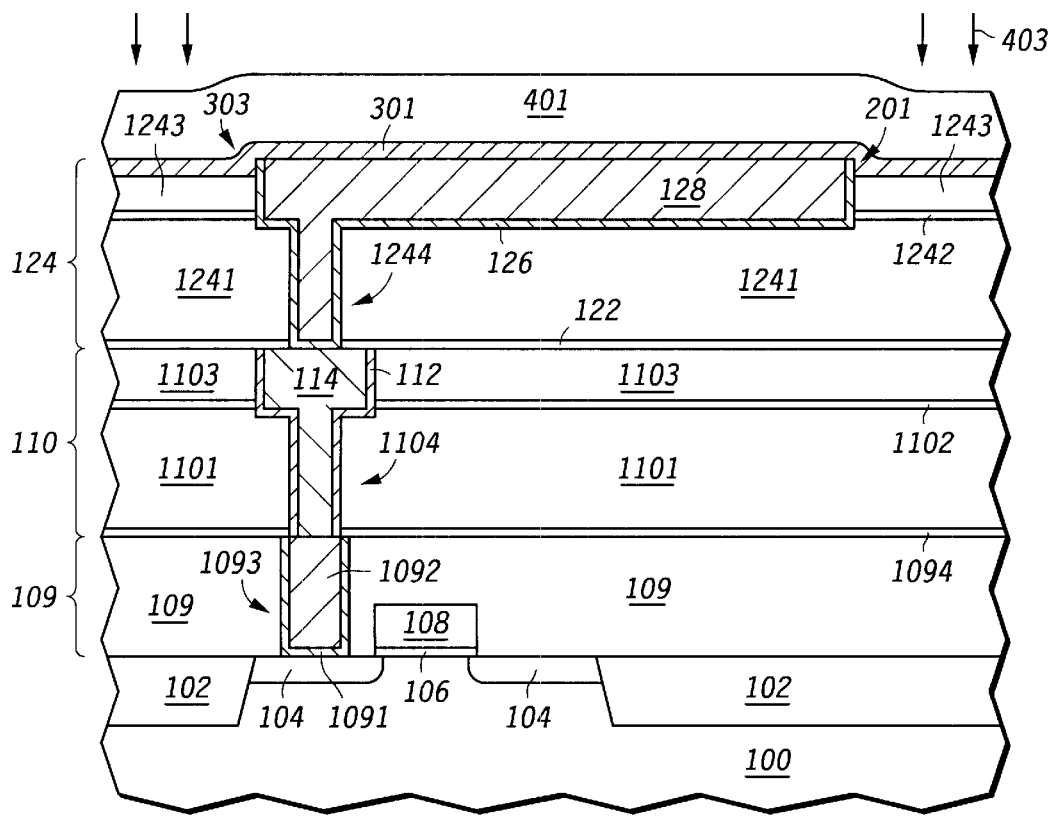
FIG. 4 includes an illustration of a cross-sectional view of the semiconductor device of FIG. 3 further showing a resist layer overlying the opaque film.

Turning now to FIG. 4, a resist layer 401 has been formed over the conductive barrier layer 301. After forming the resist layer 401 the semiconductor device substrate is placed into a photolithography tool where it is aligned and exposed using electromagnetic radiation to produce radiation induced changes in the solubility of the resist layer during subsequent development processing. In accordance with embodiments of the present invention, because the tantalum nitride film is opaque, underlying alignment marks are not visible to the lithography tool. Therefore, the topography 303 provides a means by which the photolithography tool can advantageously align the opaque layer 301 with respect to the dial inlaid interconnect 1244.

Figure 5:
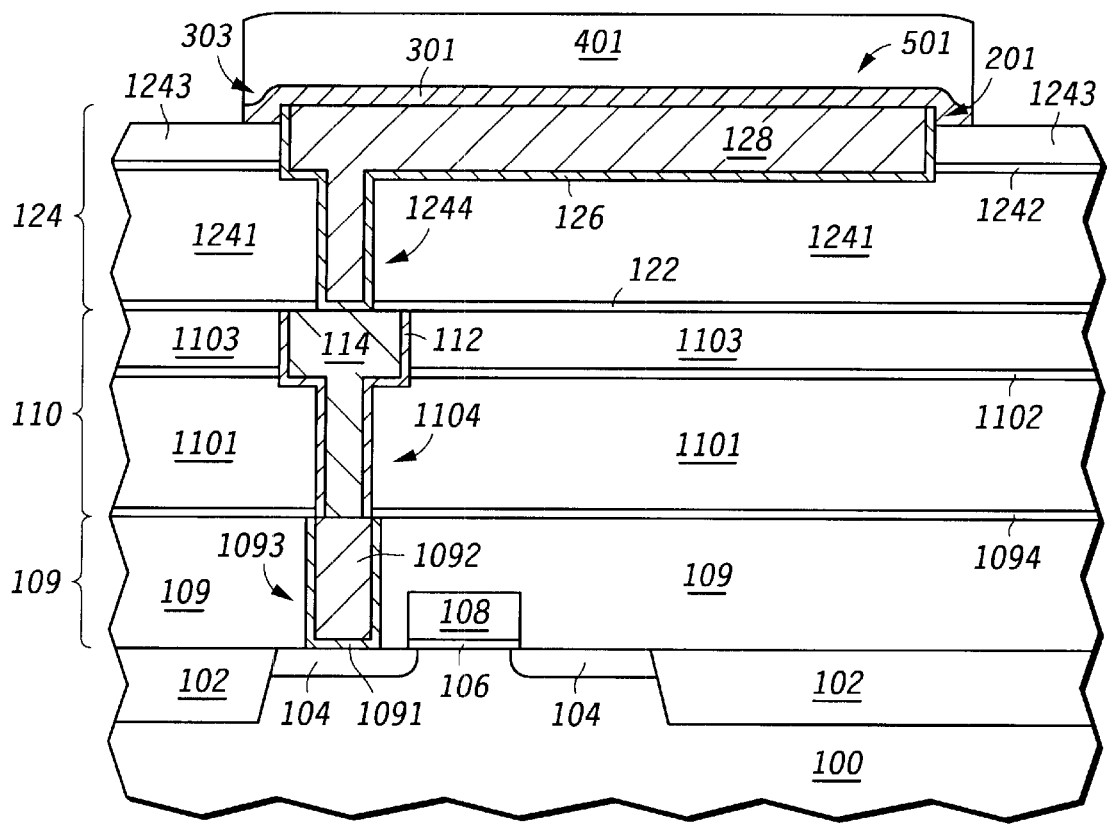
FIG. 5 includes an illustration of a cross-sectional view of the semiconductor device of FIG. 4 after patterning the resist layer and etching the opaque film.

The present inventors have found by recessing the dielectric layer 1243 to form the step 201 prior to depositing the conductive barrier layer 301 forms topography 303 which can be used as "pseudo" alignment marks. The topography significantly improves alignment of the lithography tool and correspondingly reduces overlay error. The reduction in overlay error eliminates a need for performing photo reworks caused by poor alignment. Consequently the overall throughput and cycle time at the lithography processing operation which patterns barrier layer 301 with respect to the interconnect is improved. Turning now to FIG. 5 the photo resist layer 401 has been developed using conventional photolithography developing processes to form a pattern feature over the semiconductor device substrate. In addition the opaque layer 301 has been etched to form a capping layer 501 which overlies the top surfaces of the interconnect and extends over portions of upper dielectric layer 1243. The presence of the topography produced by recessing dielectric layer 1243 has improved the alignment of the capping layer 501 to the surface of the interconnect 1244.

One of ordinary skill in the art recognizes that for embodiments, in which the conductive fill material includes predominantly copper, the opaque layer 301 functions as a conductive barrier layer and it preferably covers the exposed surfaces of the copper within the interconnect. This is desirable to minimize diffusion of copper into other regions of the semiconductor device. If the alignment of the conductive barrier layer to the interconnect is inadequate, copper diffusion into adjacent regions of the semiconductor device can occur. In addition, in embodiments where portions of the inlaid interconnect 1244 are used as bond pads, the conductive barrier layer prevents copper from the interconnect and lead tin solder from a subsequently formed bump from reacting with each other. Therefore, integrity is maintained at the interface between the bump and the interconnect. This improves the mechanical integrity of the bump as well as helps to reduce the electrical resistance between the bump and the interconnect. Additionally, since alignment of the opaque layer 301 to underlying (and overlying) features is improved, the opaque layer 301 can also be used advantageously to pattern and form improved focused energy-alterable, or laser-alterable, connections (i.e. fuses) between conductive regions of the semiconductor device. The conductivity of these connections can be modified, using a laser or the like, to program or adjust the circuitry of the device. In addition, because the conductive barrier layer's alignment to the underlying feature is improved, problems resulting from a poor alignment, such as the unintentional removal of exposed copper or corrosion of copper resulting from exposure to etch and resist chemistries is also reduced.

Figure 6:
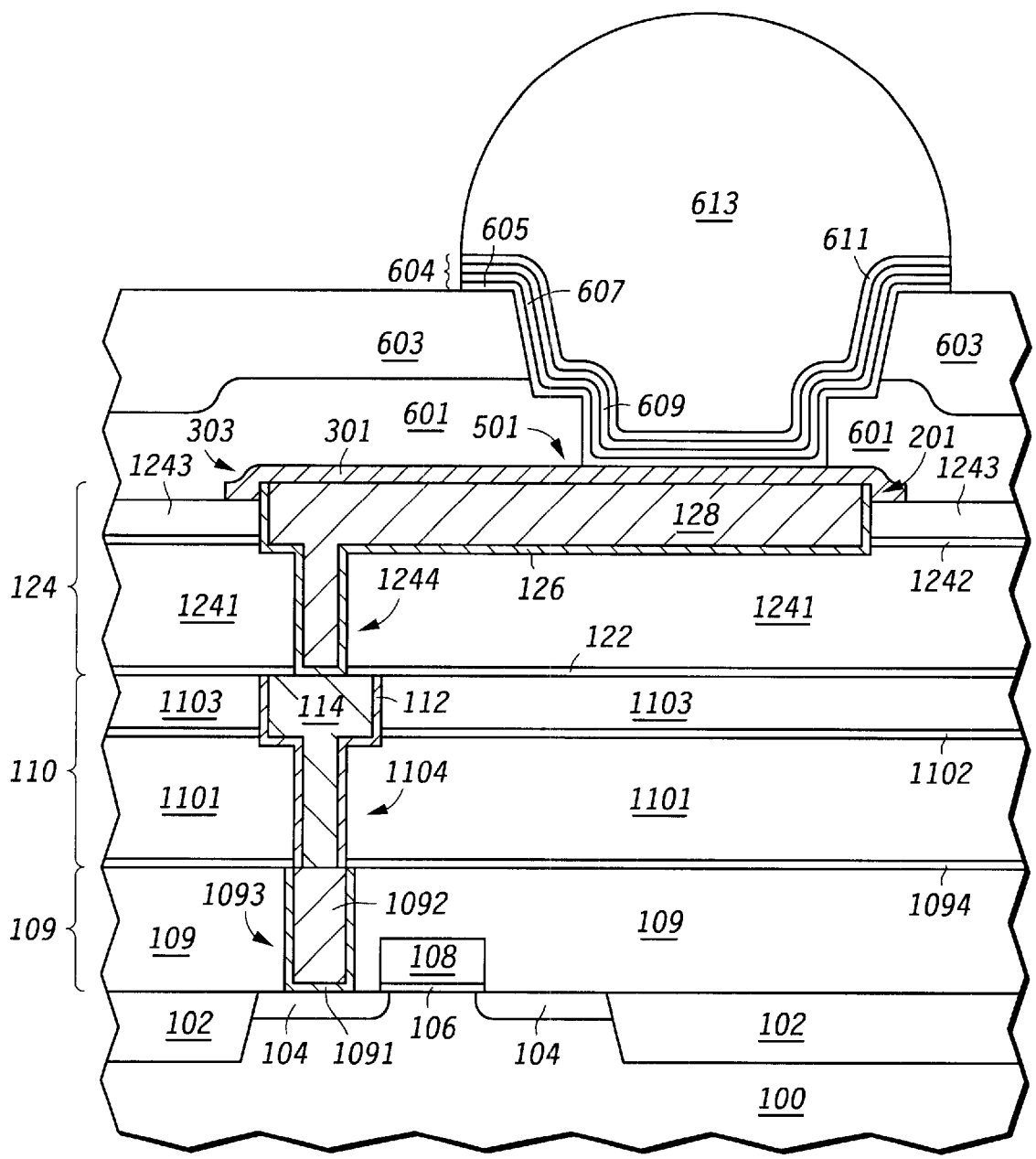
FIG. 6 includes an illustration of a cross-sectional view of a substantially completed semiconductor device.

Turning now to FIG. 6, a substantially completed semiconductor device has been formed. In FIG. 6, the resist layer 401 has been removed and a passivation layer 601 is deposited over the substrate surface using conventional CVD processing. The passivation layer can include one or more films of silicon nitride, silicon oxynitride, silicon dioxide, or the like. Portions of the passivation layer 601 closest to the capping film 501 typically include silicon nitride or a silicon oxynitride film having a higher concentration of atomic nitrogen relative to atomic oxygen. The passivation layer 601 is patterned to form a bond pad opening that exposes portions of the capping film 501. The adhesion of passivation layers to copper interconnects is typically poor. Thus, the capping film 501 additionally provides improved adhesion of the passivation layer in regions where the bond pad opening is formed.

A die coat layer 603 is then formed overlying the substrate surface and patterned to form a die coat opening as shown in FIG. 6. In accordance with one embodiment, the die coat layer 603 is a polyimide layer. The opening is formed using conventional lithographic and etch processing. The die coat opening exposes portions of the passivation layer and the bond pad opening as shown in FIG. 6. Processing is then continued to form a substantially completed bump structure as shown in FIG. 6. A pad limiting metal layer 604 is formed within the die coat opening and in one embodiment, includes a chromium film 605, a chromium copper alloy film 607, a copper film 609, and a gold film 611. A conductive bump 613 is then formed overlying the pad limiting metal. In accordance with one embodiment the conductive bump 613 includes lead tin solder. The processes and materials used to form the pad limiting metal and the lead tin sodder bump are conventional to one of ordinary skill in the art.

The embodiments of the present invention are readily extendible to a variety of other applications. For example, any time an opaque film, which is deposited on a substantially planarized surface requires alignment to an underlying feature, the surface of the wafer can be selectively etched to form topography before depositing the opaque film. This will produce stepped contrast regions in the surface of the semiconductor substrate, which can then be used to align photoresist images over the substrate surface. For example, if the barrier layer 122 were formed of an opaque material, such as those used to form the capping layer 501, the dielectric layer 1103 can be recessed with respect to the surface of the dual inlaid interconnect 1104 to provide topography for the purpose of aligning subsequent patterning films. In addition, embodiments of the present invention are advantageous because they can easily be integrated into an existing process flow without a need to use exotic materials, develop new processes, or purchase new processing equipment.

In the foregoing specification the invention has been described with reference to specific embodiments. However, one of ordinary skill in the art appreciates that various modifications and changes can be made without departing from the scope of the present invention as set forth in the claims below. Accordingly, the specification and figures are the be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A semiconductor device, comprising:

an interconnect disposed within a dielectric layer overlying a semiconductor device substrate, wherein a top surface of the dielectric layer is recessed with respect to a top surface of the interconnect to form a step; and an opaque film overlying and aligned to the interconnect, wherein the opaque film extends beyond the step and overlies a portion of the top surface of the dielectric.

2. The semiconductor device of claim 1, wherein the interconnect includes mostly copper and the opaque film is a copper barrier layer.

3. The semiconductor device of claim 2, wherein the barrier layer includes a refractory metal nitride.

4. The semiconductor device of claim 3, wherein the barrier layer includes a material selected from a group consisting of titanium, tantalum, tungsten, iridium, and nickel.

5. The semiconductor device of claim 1, wherein the recess is in a range of approximately 40–70 nanometers.

6. The semiconductor device of claim 1, wherein a portion of the interconnect is further characterized as a bond pad.

7. The semiconductor device of claim 6, wherein a portion of the opaque film is a laser-alterable connection between at least two conductive regions.

8. The semiconductor device of claim 6, further comprising a passivation layer overlying portions of the bond pad; and a conductive bump electrically contacting the bond pad.

9. The semiconductor device of claim 1, wherein a sidewall angle of the step is greater than approximately 80 degrees.

10. A method of forming a semiconductor device comprising:

planarizing a surface of a semiconductor device substrate to form a conductive member within an opening in a dielectric layer;

recessing a top surface of the dielectric layer relative to a top surface of the conductive member to define a step between the top surface of the conductive member and the top surface of the dielectric layer;

forming an opaque film overlying the semiconductor device substrate, wherein the step produces a topographically discernable feature in the surface of the opaque film;

patterning a resist layer over the opaque film, wherein an alignment of the resist layer to an underlying feature is accomplished using the topographically discernable features; and etching the opaque film to define a feature.

11. The method of claim 10, wherein the interconnect includes mostly copper and the opaque film is a copper barrier layer.

12. The method of claim 11, wherein the copper barrier layer includes a refractory metal nitride.

13. The method of claim 12, wherein the copper barrier layer includes a material selected from a group consisting of titanium, tantalum, tungsten, iridium, and nickel.

14. The method of claim 10, wherein the recess is in a range of approximately 40–70 nanometers.

15. The method of claim 10, wherein a portion of the interconnect is further characterized as a bond pad.

16. The method of claim 15, wherein a portion of the opaque film is a laser-alterable connection between at least two conductive regions.

17. The method of claim 15, further comprising:

a passivation layer overlying portions of the bond pad; and a conductive bump electrically connected to the bond pad.

18. The method of claim 10, wherein a sidewall angle of the step is greater than approximately 80 degrees.

19. The method of claim 10, wherein the recess is formed using a reactive ion etch process.

* * * * *